United States Patent [19]

Hashimoto et al.

[11] Patent Number: 5,316,891
[45] Date of Patent: May 31, 1994

[54] FINE PATTERN FORMING METHOD

[75] Inventors: Kazuhiko Hashimoto, Moriguchi; Masayuki Endo, Izumi, all of Japan

[73] Assignee: Matsushita Electric Industrial Co., Ltd., Osaka, Japan

[21] Appl. No.: 871,199

[22] Filed: Apr. 20, 1992

[30] Foreign Application Priority Data

Apr. 25, 1991 [JP] Japan .................................. 3-095437

[51] Int. Cl.$^5$ .............................................. G03C 5/00
[52] U.S. Cl. ..................... 430/296; 430/323; 430/325; 430/925; 430/313
[58] Field of Search ............... 430/296, 313, 323, 325, 430/925

[56] References Cited

U.S. PATENT DOCUMENTS

| | | | |
|---|---|---|---|
| 4,863,833 | 9/1989 | Fukuyama et al. | 430/296 |
| 4,871,646 | 10/1989 | Hayase et al. | 430/270 |
| 5,093,224 | 3/1992 | Hashimoto et al. | 430/296 |
| 5,198,326 | 3/1993 | Hashimoto et al. | 430/296 |
| 5,252,340 | 10/1993 | Hashimoto et al. | 430/296 |

OTHER PUBLICATIONS

PCT International Publication WO/86/05284 published Sep. 12, 1986.
Hackh's Chemical Dictionary, J. Grant, McGraw-Hill Book Co., N.Y., "silicone" p. 611, 1972.

*Primary Examiner*—Christopher Rodee
*Attorney, Agent, or Firm*—Stevens, Davis, Miller & Mosher

[57] ABSTRACT

A high molecular organic film as the bottom layer is coated on a semiconductor silicone substrate in a thickness of 2 μm and a solution of 2,4,6-tris(trichloromethyl)-1,3,5-triazine as a crosslinking agent and poly(p-hydroxyphenylsilsesquioxane) in ethyl cellosolve acetate is coated thereon in a thickness of 0.3 μm as the top layer electron beam resist. After exposure to electron beams, the resulting wafer is developed with an aqueous organic alkaline solution to give an accurate and fine negative resist pattern. Etching of the bottom layer using this resist pattern as a mask can readily form a fine resist pattern accurately in a high aspect ratio.

2 Claims, 4 Drawing Sheets

STANDING TIME FROM EXPOSURE
TO DEVELOPMENT
(HRS)

FINE PATTERN FORMING METHOD

BACKGROUND OF THE INVENTION

1. Field of the Invention

The present invention relates to a method for forming a fine pattern which is used for preparing a semiconductor device or integrated circuit by forming the pattern using electron beam lithography.

2. Related Art

In a conventional method for preparing IC and LSI, a pattern is formed by photography using ultraviolet rays. With an increasing demand for finer elements, a stepper lens is being equipped with high numeral apertures and a light source of short wavelength has been used but on the other hand, these embodiments encounter a drawback of causing a shallow focus depth. Furthermore, a fine pattern size of LSI element and manufacturing ASIC necessitate to apply electron beam lithography to these techniques. Fine pattern formation by this electron beam lithography is essentially required for an electron beam resist. Inter alia, polymethyl methacrylate (PMMA) is a positive type electron beam resist and known to provide the best resolution; however, its sensitivity is poor. In recent years, many reports have thus been made to increase the sensitivity of a positive type electron beam resist, and there are known positive type electron beam resists comprising, for example, polybutyl methacrylate, a copolymer of methyl methacrylate and methacrylic acid, a copolymer of methacrylic acid and acrylonitrile, a copolymer of methyl methacrylate and isobutylene, polybutene-1-sulfone, polyisopropenyl ketone, fluoropolymethacrylate, etc. These resists are all designed to easily cause scission of the principle chain with an electron beam by introducing an electron withdrawing group onto the side chain or introducing a readily degradable bond on the principle chain thereby to obtain high sensitivity. However, even these resists do not sufficiently satisfy both resolution and sensitivity. In addition, neither dry etch durability nor heat durability is sufficiently good so that these resists are used only with difficulty as masks for dry etching and have restricted application.

Turning to a negative type electron beam resist, the resist comprises a cyclized rubber and its dry etch durability is good. However, the resist involves drawbacks that close contact with a substrate is poor, it is difficult to obtain a uniform pinhole-free coated layer of high quality on the surface of a substrate, it has poor heat durability, poor resolution, etc. Therefore, various improvements have been hitherto made on negative type electron beam resists. There are proposed negative type electron beam resists comprising, for example, polyglycidyl methacrylate, chloromethylated polystyrene, chloromethylated α-methylpolystyrene, polymethacrylate maleic acid ester, polystyrene chloride, a copolymer of polyglycidyl methacrylate and ethyl acrylate, etc. These resists are all designed to easily generate a radical by an electron beam and cause crosslinking by introducing an epoxy group or a chlorine atom liable to reacting with an electron thereby to obtain high sensitivity. However, even these resists do not sufficiently satisfy both resolution and heat durability. In order to develop such a negative type resist comprising a substrate of cyclized rubber or isoprene and a thermoplastic polymer provided thereon, an organic solvent should be used so that the drawn resist might be swollen in an organic solvent developer upon development.

Furthermore, such a mono component type resist involves a problem of post polymerization when the resist is allowed to stand after exposure. The polymerization proceeds with passage of time and as the time of allowing to stand after exposure is prolonged, the size of resist pattern after development is thickened as shown in FIG. 5C. Therefore, the resolution of the pattern is lowered and in some occasion, the pattern is distorted until it cannot be used any more. In addition, the organic solvent developer is harmful in view of environment and health and is undesirable also in view of flammability.

In recent years, a concept of chemical amplification has been introduced to enhance the sensitivity of a negative type electron beam resist and research and development have been made on such a resist. In the chemical amplification, a tri-component system substance comprising a photo acid generator capable of generating an acid upon exposure to an electron beam, a monomer which is reactive by the action of the acid and a novolak resin is used as a negative type electron beam resist. As the photo acid generator which can generate an acid upon exposure to an electron beam, there are an organic halide compound, an onium salt, etc. Examples of the organic halide compound include 1,1-bis(p-chlorophenyl)-2,2,2-trichloroethane, 1,1-bi(p-methoxyphenyl)-2,2,2-trichloroethane, 1,1-bis(p-chlorophenyl)-2,2-dichloroethane, 2-chloro-6-(trichloromethyl)-pyridne, etc. Examples of the onium salt are triphenyl sulfonium, diphenyl iodonium, etc. These compounds generate a Lewis acid which is a strong acid upon exposure to an electron beam. Examples of the monomer which is reactive by the action of the acid include melamine and methylol melamine. Methylol melamine has the following chemical formula and reacts with the acid to release —OH group.

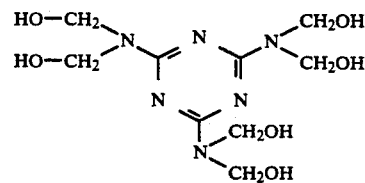

These compounds react with novolak resin which is a matrix polymer to cause the following crosslinking reaction:

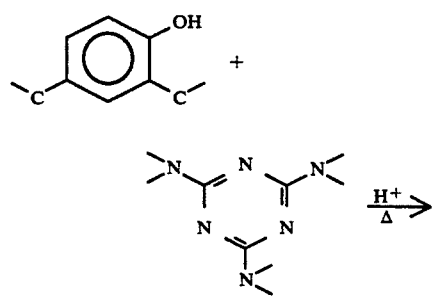

-continued

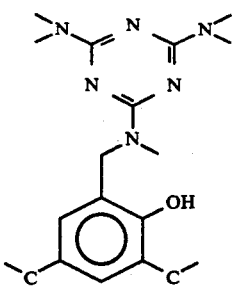

The reaction described above proceeds to cause a three dimensional crosslinking of novolak resin. That is, by exposure to an electron beam, Lewis acid generates from the acid generator and the monomer such as melamine reacts with novolak resin by the acid to form the crosslinked structure. In order to proceed the crosslinking reaction, it is necessary to bake immediately after exposure. Where the system is allowed to stand without baking, the acid generated by exposure reacts with oxygen, etc. in the air and inactivated; as shown in FIG. 5B, these compounds involve a defect that the size of resist pattern after development becomes drastically thin, as the time from exposure to baking is prolonged.

Electron beam lithography encounter drawbacks of poor dry etch durability and poor heat durability of an electron beam resist, adverse influence on pattern precision by a proximity effect due to forward scattering or back scattering of electrons. In order to compensate for these drawbacks, a multilayer resist pattern in which the function of the resist is shared into an imaging layer and a planarizing layer is extremely effective. FIGS. 6, A through D are to explain the process of a conventional tri-layer resist in electron beam lithography. In order to prevent the proximity effect, a high molecular organic layer is coated on substrate 11 in a thickness of 2 to 3 μm as the bottom layer 21 (FIG. 6A). Further thereon an inorganic film of SiO₂, etc. or an inorganic high molecular film of SOG (spin on glass), etc. is coated in a thickness of 0.2 μm as an intermediate layer 22 and an electron beam resist is further coated on the intermediate layer in a thickness of 0.5 μm as the top layer resist 23 (FIG. 6B). After a pattern is drawn with an electron beam 24, development is performed with a developer used exclusively for an organic solvent to obtain a resist pattern 23P (FIG. 6C). Next, the intermediate layer 22 is subjected to dry etching using this resist pattern 23P as a mask and the bottom layer 21 is then subjected to dry etching using this intermediate layer 21 as a mask to transfer the pattern (FIG. 6D). A fine pattern can be formed in a high aspect ratio through the foregoing multilayer resist process. In such a tri-layer resist process, however, steps are more complicated and defects frequently occur. Further where selectivity in etching in the intermediate layer and the bottom layer is small, there is a problem that a pattern size shift in transferring the pattern becomes larger than 0.1 μm. Therefore, the tri-layer resist process is not practical, either.

As described above, the tri-layer resist process is an effective process but involves problems in complicated steps, deviation of resist size in transfer of a pattern, etc. In the case of electron beam lithography, an incident electron causes scattering inside the resist; the electron which reaches a substrate causes back scattering, and again returns into the resist to sensitize the resist. Since pattern precision is seriously deteriorated by such a proximity effect, it is necessary to provide a thick bottom layer to prevent the back scattering electron. Thus, a silicon containing resist for a bilayer resist process which has the function as a mask for the bottom layer and as a resist layer at the same time, an inorganic resist, etc. have been developed. There are, for example, a resist pattern having a siloxane bond on the principle chain, ladder type polysiloxane, chalcogenide glass type inorganic resist, etc. However, these resists cannot sufficently improve dry etching durability, are poor in sensitivity and resolution and are thus far away from practical use. In fact, sensitivity and resolution of these conventional resists are about 20 μC/cm² and about 1 μm, respectively. Since an organic solvent is used as a development, these resists involve additional problems that change in sensitivity and change in size of such resists are large, process allowance is small, swelling occurs upon development and a resist pattern cannot be formed accurately. In addition, there are problems of environmental pollution, harmfulness to human, etc. In order to solve these problems, the present inventors have accomplished highly sensitive silicon-containing electron beam resists and a fine pattern forming method using these resists.

SUMMARY OF THE INVENTION

The fine pattern forming material of the present invention comprises a polysilicone resin containing a silicon atom on the principle chain and having a hydroxy group on the side chain as a substituent, which is soluble in an alkaline solution, and crosslinking agent which can form at least two radicals upon exposure to an electron beam and the polysilicone resin, which radicals can cause a three dimensional crosslinking reaction, preferably the polysilicone resin being a ladder type polysilicone polymer or a ladder type polysilane polymer and the crosslinker being selected from a triazine and a melamine which are substituted with a chlorine atom(s).

The fine pattern forming method of the present invention provides a method which comprises:

a step of coating a high molecular organic film onto a semiconductor substrate followed by baking;

a step of coating onto the high molecular organic film a photosensitive solution comprising a polysilicone resin containing a silicon atom on the principle chain and having a hydroxy group on the side chain as a substituent, which is soluble in an aqueous alkaline solution, and a crosslinking agent which can form at least two radicals upon exposure to an electron beam, which radicals can cause a three dimensional crosslinking reaction with the polysilicone resin, followed by baking;

a step of writing a pattern by exposure to an electron beam, then developing the pattern with an aqueous alkaline solution to form negative resist pattern; and, a step of etching the high molecular organic film using this resist pattern as a mask.

According to the present invention, a highly sensitive negative type fine resist pattern having high resolution and excellent dry etching durability can be formed by using as a negative type electron beam resist the two-component system a ladder type polysilicone polymer or a ladder type polysilane polymer containing a silicon atom on the principle chain and having a hydroxy group on the side chain as a substituent, which is soluble in an alkaline solution and a crosslinking agent monomer of a chlorine-substituted triazine or melamine which can form at least two radicals upon exposure to an electron beam and the polysilicone resin which radicals can cause a three dimensional crosslinking reaction. According to the present invention, a stable resist pattern independent on the time for allowing to stand after exposure can be obtained because no baking is required after the exposure. Furthermore, an aqueous organic alkaline solution can be used as a developer so that no swelling occurs upon development, neither environmental problem nor harmfulness to human occurs; thus, a fine resist pattern can be easily formed. In addition, this silicon-containing resist has a sufficiently satisfactory dry etch durability in etching when the pattern is transferred, and as a result, a fine resist pattern having a high aspect ratio and free of size shift can be easily formed with high precision by using the silicon-containing resist as the top resist in the bilayer resist.

That is, a conventional negative type resist involves a problem of so called post polymerization where polymerization proceeds when the resist is allowed to stand without development after exposure, whereby polymerization is caused even in an area not exposed to an electron beam. As shown in FIG. 5C, as the standing time after exposure is prolonged, a size of the pattern after development increases. Further when a resist in the chemical amplification system is allowed to stand after exposure without baking, the acid formed by exposure reacts with oxygen in the air, amine, etc. to be inactivated, and as shown in FIG. 5B, a size of the resist pattern after exposure becomes suddenly thin, as the time from exposure to baking is prolonged. However, by using the triazine or melamine substituted with chlorine as a crosslinking agent, no deterioration occurs in resist pattern size dependent on the time period from exposure to development so that a stable resist pattern can be formed, as shown in FIG. 5A. Furthermore the crosslinking agent contains chlorine which is highly sensitive to an electron beam and therefore, three dimensional crosslinking reaction proceeds between the crosslinking agent and the polysilicone resin in a small exposure dose, and an aqueous alkaline solution can be used as a developer since the polysilicone resin is soluble in a hydroxysubstituted aqueous alkaline solution. No swelling occurs in development and hence, a resist pattern can be formed in high sensitivity and high resolution. By using a ladder type polysilicone polymer or polysilane polymer as the polysilicone resin, a resist pattern having excellent dry etch durability can be obtained and using this resist pattern as a mask, a size shift can be minimized when the bottom layer is etched to transfer the pattern. Therefore, a fine resist pattern can be easily formed with high precision.

PREFERRED EMBODIMENTS OF THE INVENTION

Figure 1A:
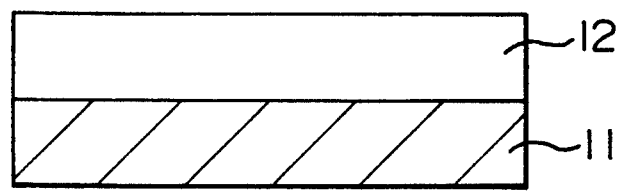
FIG. 1, A through D show cross-sectional drawings showing a fine pattern forming method in one embodiment of the present invention.
Figure 1B:
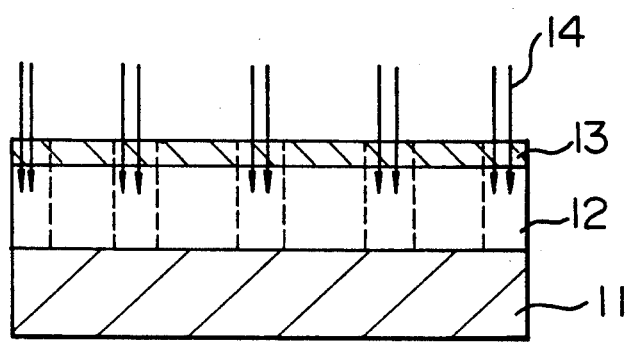
Figure 1C:
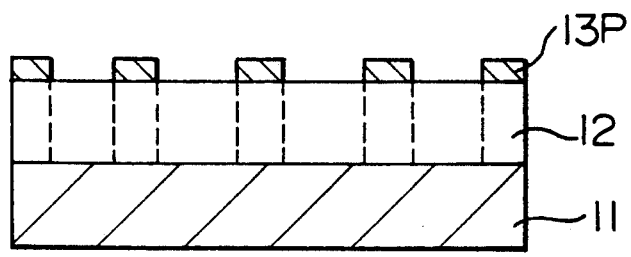
Figure 1D:
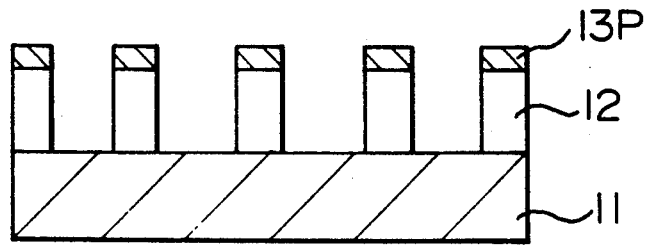

According to the present invention, a fine resist pattern with high contrast, high accuracy and high resolution can be easily obtained using the silicon-containing electron beam resist described above and by the process using the same. In particular, a resist pattern size can be stably obtained without post polymerization observed with conventional negative type resists, without decrease in a resist pattern size dependent on the standing time after exposure which is observed with resists in chemical amplification system requiring baking after exposure. In the present invention, the number of steps is less than that in the conventional processes. In addition, the polysilicone resin which is a matrix polymer is soluble in an aqueous alkaline solution so that an aqueous alkaline solution can be used as a developer and a resist pattern can be precisely formed without causing swelling upon development. Further by using a bilayer resist process, the steps of processing a resist can be simplified, and a fine resist pattern having an excellent dry etch durability and free of size shift upon transfer of a pattern can be easily formed with high precision and high sensitivity, using a ladder type polysilicone resin which enables to use an aqueous alkaline solution as a developer. Therefore, the present invention can efficiently contribute to easily forming a fine resist pattern with minimized fault, high precision and high resolution.

Comparison between a conventional silicone type resist and the novel resist of the present invention is shown in the following table.

|  | Conventional Resist | Resist of invention |
| --- | --- | --- |
| Sensitivity | about 20 μC/cm$^2$ | about 10 μC/cm$^2$ |
| Resolution | 0.6 μm | about 0.3 μm |
| γ Value | about 3 | 5 |
| Dry etch durability | Δ | ○ |
| Heat durability | Δ | ○ |
| Selective ratio to photoresist | about 20 | ≧50 |
| Size shift by etching | large | small |
| Alkaline development | x | ○ |
| Swelling | occurred | not occurred |
| Variance of sensitivity | found | not found |
| Close adhesion | Δ | ○ |

Firstly, the present invention is described briefly. The present invention aims at solving the foregoing problems, using as a negative type electron beam resist a two component system substance comprising a polysilicone resin containing a silicon atom on the principle chain and having a hydroxy group on the side chain as a substituent, which is soluble in an alkaline solution, and a crosslinking agent which can form at least two radicals upon exposure to an electron beam, which radicals can cause a three dimensional crosslinking reaction with the polysilicone resin. It is particular preferred to use a ladder type polysilicone polymer or a ladder type polysilane polymer as the polysilicone resin and a triazine or a melamine which is substituted with a chlorine atom(s), as the crosslinking agent. That is, the polysilicone resin as a main polymer which is used herein should be an alkaline soluble polymer. For example, the following compounds are alkaline soluble.

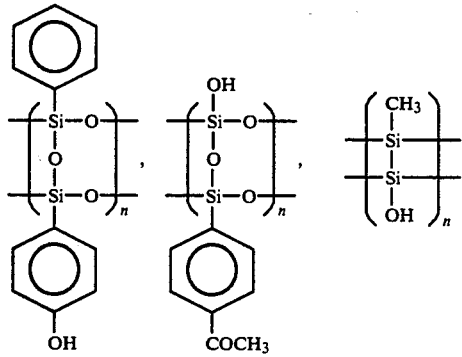

The triazine and melamine substituted with chlorine have the following structures:

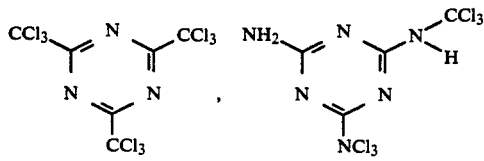

and upon exposure to an electron beam, cause the following crosslinking reaction with the polysilicone resin as a main polymer.

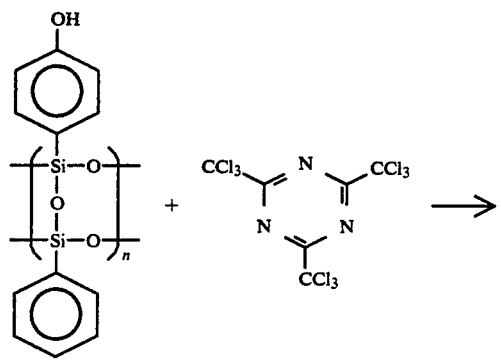

-continued

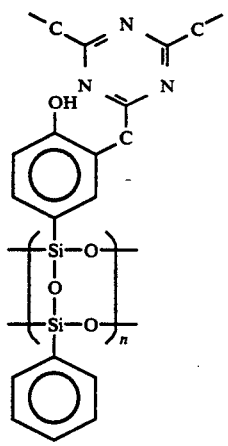

The reaction described above proceeds to cause the three dimensional crosslinking reaction of the silicon resin. That is, by exposure to an electron beam, the triazine or melamine substituted with chlorine generates at least two radicals and the radicals react with the polysilicone resin to form a crosslinking structure. Accordingly, post polymerization does not occur when the resist is allowed to stand after exposure. No post baking is required and the steps are simplified. Thus, a stable resist pattern size can be obtained. The polysilicone resin is alkaline soluble in its nature. Therefore, the unexposed area is dissolved in an alkaline developer but the exposed area is dissolved only with difficulty since the area is crosslinked. A negative type resist can thus be formed. By using these silicon-containing substance as the top layer resist in a bilayer resist, a multilayer resist can easily be formed. Therefore, a negative type fine resist pattern having a satisfactory dry etch durability, free of size shift due to etching upon transfer of a pattern, having a sufficiently high sensitivity can be obtained in a simple manner with precision, without swelling upon exposure since an organic alkaline solution can be used as a developer, without any environmental pollution and any harm to human.

EXAMPLE 1

Hereafter the fine pattern forming material which is an embodiment of the present invention is described below.

Figure 2:
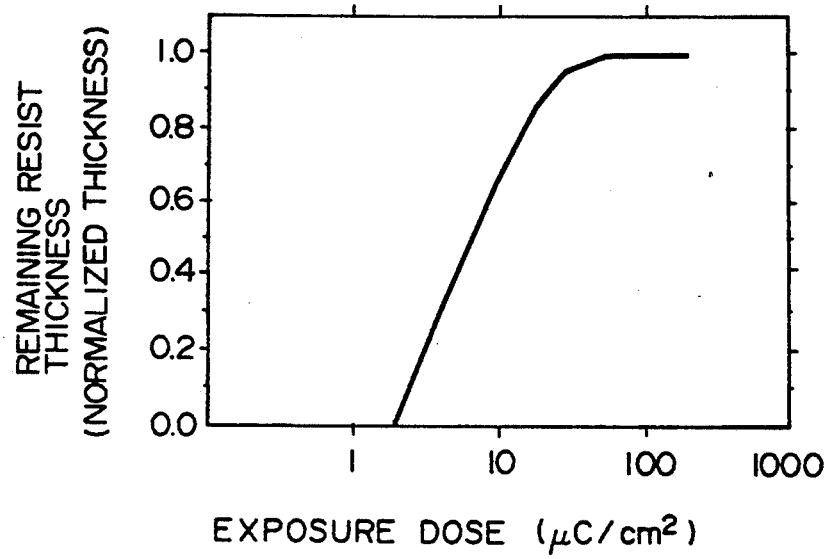
FIG. 2 shows a sensitivity curve which represents the relationship between dose and remaining resist thickness (normalized thickness) in a fine pattern forming material in one embodiment of the present invention.

In ethyl cellosolve acetate were dissolved 1.0 g of 2,4,6-tris(trichloromethyl)-1,3,5-triazine as a crosslinking agent and 15 g of poly(p-hydroxyphenylsilsesquioxane) to prepare a mixture. The mixture was gently stirred at 25° C. for 60 minutes. Insoluble matters were filtered off to make a homogeneous solution. The solution was dropped on a semiconductor substrate followed by spin coating at 2000 rpm for a minute. The resulting wafer was baked at 90° C. for 20 minutes to form a resist film of 1.0 μm in thickness. This resist film was exposed to an electron beam at a dose of 1 to 300 μC/cm$^2$ at accelerated voltage of 20 kV followed by development with an ordinary aqueous organic alkaline solution for a minute. In the thus obtained pattern, a sensitivity curve showing the relationship between the remaining resist thickness and the dose is shown in FIG. 2. The sensitivity curve reveals that the sensitivity of this resist film is approximately 10 μC/cm$^2$.

Figure 3:
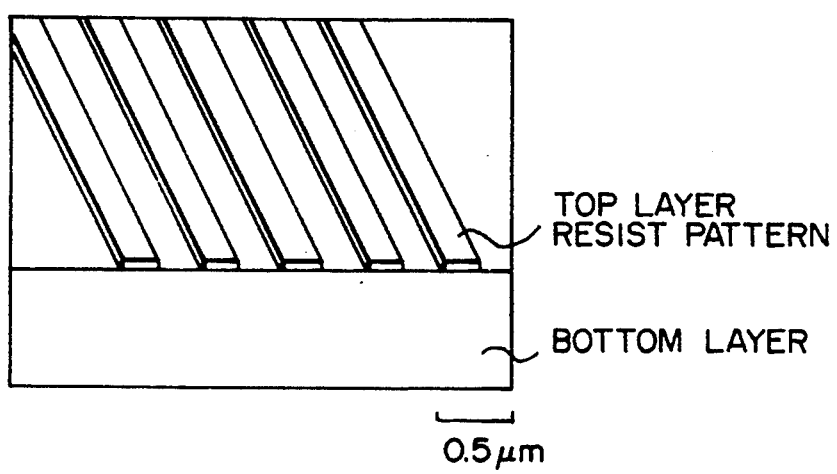
FIG. 3 shows a scanning electron microscopic photograph of the cross section of a resist pattern having 0.3 μm line and space formed using a fine pattern forming material in one embodiment of the present invention.

This resist film was exposed to an electron beam at accelerated voltage of 20 kV in a dose of 10 μC/cm² followed by development with an aqueous organic alkaline solution for a minute. A precise and fine negative type resist pattern was obtained. FIG. 3 illustrates a cross-sectional electron microscopic photograph of the resist pattern of 0.3 μm line and space thus obtained. The illustrated drawing reveals that a fine resist pattern having high resolution can be obtained.

As described above, according to this embodiment, the negative type fine resist pattern can be obtained stably with high sensitivity and high resolution, by using as a crosslinking agent the chlorine substituted triazine and as a main polymer the ladder type polysiloxane resin.

EXAMPLE 2

Hereinafter, a fine pattern forming material in another embodiment of the present invention is described.

In an ethyl cellosolve acetate were dissolved 1.0 g of 2,4,6-tris(trichloromethyl)melamine as a crosslinking agent and 15 g of ladded type poly(p-hydroxyphenylsilane) in a manner similar to Example 1 to prepare a mixture. The mixture was gently stirred at 25° C. for 60 minutes. Insoluble matters were filtered off to make a homogeneous solution. The solution was dropped on a semiconductor substrate followed by spin coating at 2000 rpm for a minute. The resulting wafer was baked at 90° C. for 20 minutes to form a resist film of 1.0 μm in thickness. This resist film was exposed to an electron beam at a dose of 10 μC/cm² at accelerated voltage of 30 kV followed by development with an ordinary aqueous organic alkaline solution for a minute. A precise and fine negative type resist pattern was obtained.

As described above, according to this embodiment, the negative type fine resist pattern can be obtained stably with high sensitivity and high resolution, by using as a crosslinking agent the chlorine-substituted melamine and as a main polymer the ladder type polysilane resin.

EXAMPLE 3

Hereinafter a fine pattern forming method in one embodiment of the present invention is described by referring to the drawings.

Figure 4:
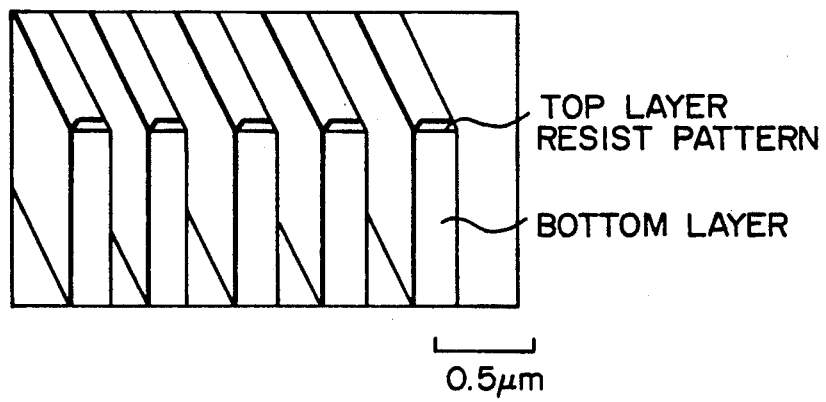
FIG. 4 shows a scanning electron microscopic photograph of the cross section of a resist pattern having 0.3 μm line and space formed using a fine pattern forming material after etching of the bottom layer in one embodiment of the present invention.
Figure 5:
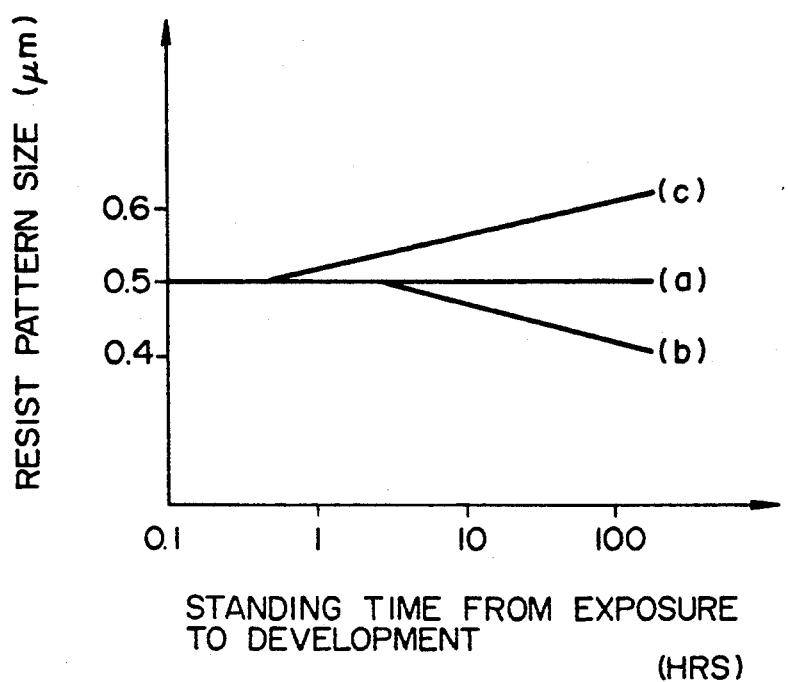
FIG. 5 shows resist patterns (a)-(c) providing a comparison of a fine pattern forming material in one embodiment of the present invention (pattern (a)) with a conventional negative type resist (pattern (c)) and a resist pattern in chemical amplification system (pattern (b)), showing relation ship between the standing time from exposure to development and a size of resist pattern after development.
Figure 6A:
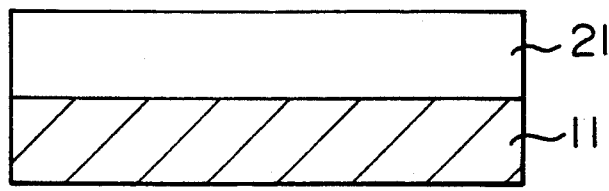
FIG. 6, A through D show cross sectional views of a fine pattern forming method when conventional trilayer resist process is used.
Figure 6B:
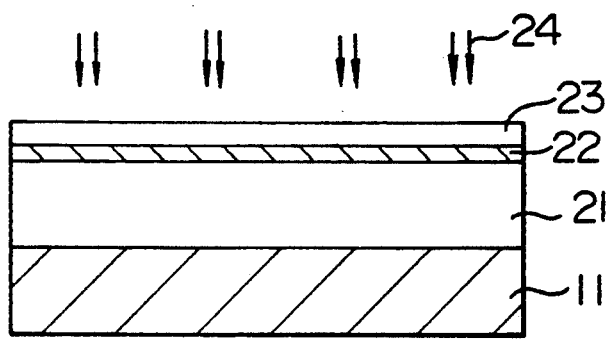
Figure 6C:
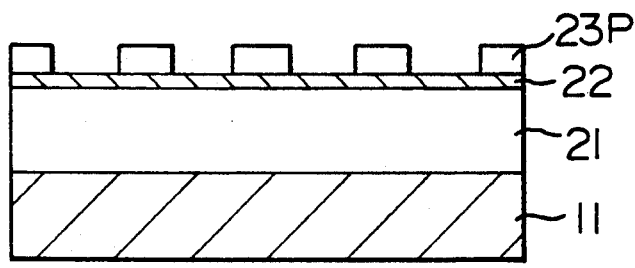
Figure 6D:
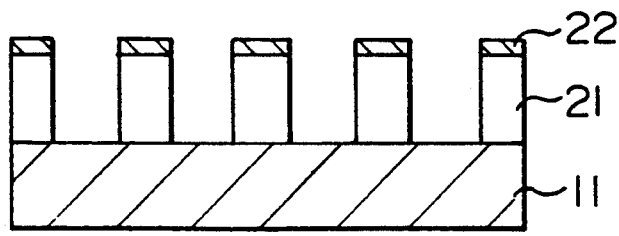

FIG. 1 shows cross-sectional views in the flow chart of a fine pattern forming method in one embodiment of the present invention. A high molecular organic film is coated on a semiconductor substrate 11 as the top layer resist 12 in a thickness of 2 μm followed by baking at 220° C. for 20 minutes (FIG. 1A). The substance obtained in Example 1 is applied thereon as the top layer electron beam resist 13 in a thickness of 0.3 μm followed by baking at 90° C. for 20 minutes (FIG. 1B). Next, exposure is performed by electron beam 14 at accelerated voltage of 20 kV in a dose of 10 μC/cm². The resulting wafer is developed with an aqueous organic alkaline solution for a minute, whereby a precise and fine negative type resist pattern 13P can be obtained as shown in FIG. 3 (FIG. 1C). Using this resist pattern 13P as a mask, the bottom layer 12 is etched. As shown in FIG. 4, a fine resist pattern of 0.3 μm line and space can be obtained accurately vertically (FIG. 1D). In this case, the selectivity ratio of the resist film to the bottom layer in etching is more than 50 so that a size shift in etching upon transfer of the pattern is less than 0.05 μm, indicating that the top layer resist pattern can be precisely transferred, as shown in FIG. 4.

As described above, according to this embodiment, the negative type fine resist pattern can be obtained stably with high sensitivity and high resolution, by using as a crosslinking agent the chlorinesubstituted triazine, and using the silicon-containing resist using the ladder type polysiloxane resin as a main polymer in the top layer resist of the bilayer resist.

What is claimed is:

1. In a fine pattern forming method comprising a step of coating a high molecular organic film onto a semiconductor substrate followed by baking, a step of coating a photosensitive solution onto the high molecular organic film, followed by baking, a step of writing a pattern by exposure to an electron beam, then developing the pattern with an aqueous alkaline solution to form a negative resist pattern, and a step of etching the high molecular organic film using this resist pattern as a mask, the improvement wherein said photosensitive solution comprises:

a silicon-containing resin which contains silicon atoms in the principle chain, has a hydroxy group as part of the side chains, is soluble in an aqueous alkaline solution, and is selected from the group consisting of ladder-shaped polysiloxanes and ladder-shaped polysilanes; and a crosslinking agent which forms at least two radicals upon exposure to an electron beam, which cause a three dimensional crosslinking reaction with the silicon-containing resin, said crosslinking agent being selected from the group consisting of triazines and melamines which are substituted with a chlorine atom(s).

2. In a fine pattern forming method comprising a step of coating a high molecular organic film onto a semiconductor substrate followed by baking, a step of coating a photosensitive solution onto the high molecular organic film, followed by baking, a step of writing a pattern by exposure to an electron beam, then developing the pattern with an aqueous alkaline solution to form a negative resist pattern, and a step of etching the high molecular organic film using this resist pattern as a mask, the improvement wherein said photosensitive solution comprises:

a silicon-containing resin selected from the group consisting of

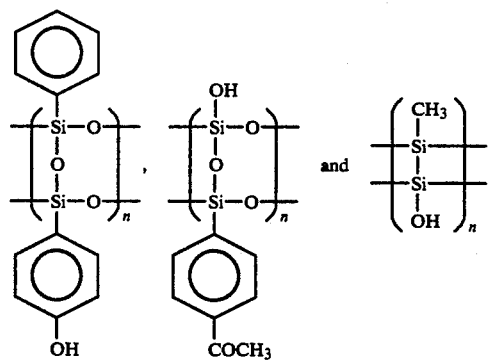

; and a crosslinking agent which forms at least two radicals upon exposure to an electron beam, which radicals cause a three dimensional crosslinking reaction with the silicon-containing resin, said crosslinking agent being selected from the group consisting of triazines and melamines which are substituted with a chlorine atom(s).

* * * * *